US012643308B2

(12) United States Patent
Saito et al.

(10) Patent No.: US 12,643,308 B2
(45) Date of Patent: Jun. 2, 2026

(54) RESIN COMPOSITION, PREPREG, RESIN-COATED FILM, RESIN-COATED METAL FOIL, METAL-CLAD LAMINATE, AND WIRING BOARD

(71) Applicant: PANASONIC INTELLECTUAL PROPERTY MANAGEMENT CO., LTD., Osaka (JP)

(72) Inventors: Hirosuke Saito, Osaka (JP); Hiroaki Fujiwara, Nara (JP); Kosuke Tsuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 371 days.

(21) Appl. No.: 16/489,880

(22) PCT Filed: Dec. 25, 2017

(86) PCT No.: PCT/JP2017/046298
§ 371 (c)(1),
(2) Date: Aug. 29, 2019

(87) PCT Pub. No.: WO2018/159080
PCT Pub. Date: Sep. 7, 2018

(65) Prior Publication Data

US 2020/0001573 A1 Jan. 2, 2020

(30) Foreign Application Priority Data

Mar. 2, 2017 (JP) ................................ 2017-039725

(51) Int. Cl.

*B32B 15/08* (2006.01)
*B32B 27/30* (2006.01)
*C08F 290/06* (2006.01)
*C08J 5/24* (2006.01)
*H05K 1/03* (2006.01)

(52) U.S. Cl.

CPC .............. *B32B 15/08* (2013.01); *B32B 27/30* (2013.01); *C08F 290/06* (2013.01); *C08J 5/244* (2021.05); *C08J 5/249* (2021.05); *H05K 1/0353* (2013.01)

(58) Field of Classification Search

CPC ....... B32B 15/08; B32B 27/30; C08F 290/06; C08F 290/062; H05K 1/0353; H05K 2201/0133

See application file for complete search history.

(56) References Cited

U.S. PATENT DOCUMENTS

| | | | |
|---|---|---|---|
| 6,455,784 B1 | 9/2002 | Kinoshita et al. | |
| 2001/0053450 A1 | 12/2001 | Yeager et al. | |
| 2001/0053820 A1 | 12/2001 | Yeager et al. | |
| 2002/0028337 A1 | 3/2002 | Yeager et al. | |
| 2002/0169256 A1 | 11/2002 | Merfeld et al. | |
| 2003/0096123 A1 | 5/2003 | Yeager | |
| 2006/0041068 A1 | 2/2006 | Ohno et al. | |
| 2007/0129502 A1 | 6/2007 | Kawabe et al. | |
| 2007/0191577 A1 | 8/2007 | Yeager et al. | |
| 2013/0203922 A1* | 8/2013 | Horiuchi | H01B 3/427 524/412 |
| 2014/0275377 A1* | 9/2014 | Yin | C08L 71/12 524/290 |
| 2016/0036013 A1* | 2/2016 | Nakazato | B32B 27/36 429/181 |
| 2016/0060429 A1 | 3/2016 | Kitai et al. | |
| 2016/0289446 A1* | 10/2016 | Endo | C08K 5/14 |
| 2017/0354033 A1 | 12/2017 | Uchida et al. | |
| 2018/0002485 A1† | 1/2018 | Tanigawa | |

FOREIGN PATENT DOCUMENTS

| | | |
|---|---|---|
| JP | 08-208778 | 8/1996 |
| JP | 2001-196729 | 7/2001 |
| JP | 2003-515642 | 5/2003 |
| JP | 2006-083364 | 3/2006 |

(Continued)

OTHER PUBLICATIONS

Machine Translation of WO 2016114286 A1 (Year: 2016).*

(Continued)

*Primary Examiner* — Callie E Shosho
*Assistant Examiner* — Bethany M Miller
(74) *Attorney, Agent, or Firm* — GREENBLUM & BERNSTEIN, P.L.C.

(57) ABSTRACT

A resin composition which comprises: a modified polyphenylene ether having, at a terminal, a group represented by a formula (1) given below; a radical-polymerizable compound having, only at molecular terminals, two or more bonds or groups of at least one selected from the group consisting of a carbon-carbon unsaturated double bond and a maleimide group; a styrene-based thermoplastic elastomer in which repeating units having a carbon-carbon unsaturated double bond not belonging to an aromatic ring are contained in an amount less than 10 mol % with respect to all the repeating units; and an organic peroxide. In the formula (1), $R_1$ represents a hydrogen atom or an alkyl group.

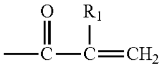

(1)

12 Claims, 5 Drawing Sheets

(56) References Cited

FOREIGN PATENT DOCUMENTS

| | | | | | |
|---|---|---|---|---|---|
| JP | 2007-051225 | A | | 3/2007 | |
| JP | 2007-191681 | | | 8/2007 | |
| JP | 2008-248141 | A | | 10/2008 | |
| JP | 2015-086330 | | | 5/2015 | |
| JP | 2016-27131 | A | † | 2/2016 | |
| JP | 2016027131 | A | * | 2/2016 | |
| WO | 2005/073264 | A1 | | 8/2005 | |
| WO | WO-2015146950 | A1 | * | 10/2015 | ......... H01L 21/6835 |
| WO | WO-2016114286 | A1 | * | 7/2016 | .............. C08L 79/08 |
| WO | 2016/132929 | A1 | | 8/2016 | |

OTHER PUBLICATIONS

Machine Translation of JP 2016/027131 A (Year: 2016).*
Machine Translation of WO 2015146950 A1, PatentScope (Year: 2015).*
ISR issued in International Bureau of WIPO Patent Application No. PCT/JP2017/046298, dated Mar. 27, 2018, (English translation).

* cited by examiner
† cited by third party

RESIN COMPOSITION, PREPREG, RESIN-COATED FILM, RESIN-COATED METAL FOIL, METAL-CLAD LAMINATE, AND WIRING BOARD

TECHNICAL FIELD

The present invention relates to a resin composition, a prepreg, a resin-coated film, a resin-coated metal foil, a metal-clad laminate, and a wiring board.

BACKGROUND ART

In recent years, in accordance with increase in the information processing amount, various kinds of electronic apparatus undergo rapid development of mounting techniques such as achieving a higher integration of a semiconductor device to be mounted, a higher density of wiring, and a larger number of layers to be laminated. In a substrate material for constructing a base member of a wiring board used in various kinds of electronic apparatus, it is demanded that the dielectric constant and the dielectric loss tangent are small in order to increase the transmission speed of signals and to reduce the loss in signal transmission.

It is known in the art that a polyphenylene ether (PPE) is excellent in dielectric properties such as having a low dielectric constant and a low dielectric loss tangent, and is also excellent in dielectric properties such as a dielectric constant and a dielectric loss tangent in high-frequency bands (high-frequency regions) of the MHz band to the GHz band. For this reason, it is studied that a polyphenylene ether is used, for example, as a molding material for high frequency. More specifically, a polyphenylene ether is preferably used as a substrate material or the like for constructing a base member of a wiring board that is provided in an electronic apparatus using a high-frequency band.

Also, as a substrate material for constructing a base member of a wiring board, a resin composition containing an elastomer or the like may be used for enhancing the dielectric properties. Such resin compositions containing an elastomer may be, for example, resin compositions disclosed in Patent Literatures 1 and 2.

Patent Literature 1 discloses a curable resin composition containing, as essential components, a predetermined vinyl compound having a polyphenylene ether skeleton and a high molecular weight body having a weight average molecular weight of 10000 or more such as a styrene-based thermoplastic elastomer. According to Patent Literature 1, it is disclosed that tackiness is absent when the resin composition is formed into a curable film, and a cured product having a low dielectric constant and a low dielectric loss tangent and being excellent in heat resistance can be given.

Patent Literature 2 discloses a curable resin composition containing a predetermined vinyl compound having a polyphenylene ether skeleton, a styrene-based thermoplastic elastomer having a double bond, and a polymerization inhibitor or an antioxidant such as t-butylhydroquinone. According to Patent Literature 2, it is disclosed that a cured product having a low dielectric constant and a low dielectric loss tangent and being excellent in heat resistance can be given.

On the other hand, in recent years, for use in an automotive millimeter-wave radar or the like, heat generation of a chip mounted on a wiring board is a problem. Also, since the wiring board is exposed to a high temperature environment such as exceeding 100° C. in terms of a junction temperature (junction temperature), it is demanded that the wiring board has stability of electric properties in a high temperature environment. From this, it is demanded in the base member of the wiring board that, for example, thermal degradation on the dielectric properties is hardly generated.

CITATION LIST

Patent Literature

Patent Literature 1: Japanese Unexamined Patent Publication No. 2006-83364
Patent Literature 2: Japanese Unexamined Patent Publication No. 2007-191681

SUMMARY OF INVENTION

An object of the present invention is to provide a resin composition by which a cured product with excellent dielectric properties and with sufficiently suppressed generation of thermal degradation on the dielectric properties can be obtained. Also, an object of the present invention is to provide a prepreg, a resin-coated film, a resin-coated metal foil, a metal-clad laminate, and a wiring board that are obtained by using the aforementioned resin composition.

One aspect of the present invention is directed to a resin composition containing a modified polyphenylene ether having, at a terminal, a group represented by a formula (1) given below; a radical-polymerizable compound having, only at molecular terminals, two or more bonds or groups of at least one selected from the group consisting of a carbon-carbon unsaturated double bond and a maleimide group; a styrene-based thermoplastic elastomer in which repeating units having a carbon-carbon unsaturated double bond not belonging to an aromatic ring are contained in an amount less than 10 mol % with respect to all the repeating units; and an organic peroxide.

[Formula 1]

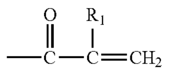

(1)

In the formula (1), $R_1$ represents a hydrogen atom or an alkyl group.

The foregoing and other objects, features, and advantages of the present invention will be apparent from the following detailed description.

DESCRIPTION OF EMBODIMENTS

Figure 1:
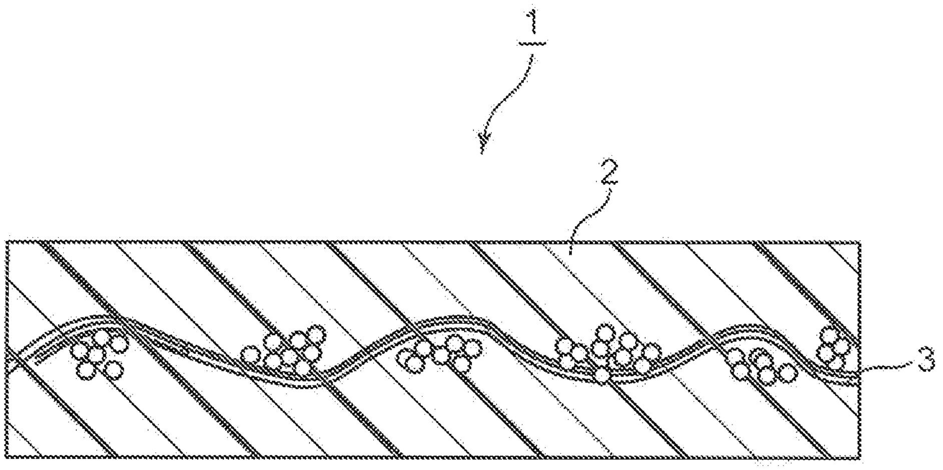
FIG. 1 is a schematic sectional view showing one example of a prepreg according to an embodiment of the present invention.

When the curable resin composition disclosed in Patent Literature 1 or 2 is used, decrease in electric properties in a high temperature environment could not be sufficiently suppressed. This seems to be due to the following reason. First, the vinyl compound contained in the aforementioned curable resin composition is bonded to the terminal of the polyphenylene ether skeleton via an aromatic ring such as a vinylbenzyl group and a methylene group. This methylene group is liable to be oxidized by heat. Also, when a non-hydrogenated styrene-based thermoplastic elastomer is used as a high molecular weight body contained in the curable resin composition, the a-position carbon moiety of the 1,2-vinyl bond or vinylene bond contained in the structure of this elastomer is also liable to be oxidized by heat, thereby degrading the electric properties in a high temperature environment.

Further, when a polymerization inhibitor or an antioxidant such as t-butylhydroquinone is incorporated as disclosed in Patent Literature 2, electric properties are degraded in a high temperature environment, though the stability of storage in varnish may possibly be enhanced. This seems to be due to the fact that, in a curing reaction in a radical polymerization system such as a vinyl compound, the effect of adding an antioxidant decreases, and the oxidation prevention effect in the cured product cannot be fully exhibited.

As a result of various studies, the present inventors have found out that the aforementioned object, such as providing a resin composition by which a cured product with excellent dielectric properties and with sufficiently suppressed generation of thermal degradation on the dielectric properties can be obtained, can be achieved by the present invention described below. Here, the state of being excellent in dielectric properties refers to the state of having a low dielectric constant or having a low dielectric loss tangent, particularly, the state of having a low dielectric loss tangent. Also, the thermal degradation on the dielectric properties refers to an increase in the dielectric constant or an increase in the dielectric loss tangent caused by heating of the cured product, particularly, an increase in the dielectric loss tangent caused by heating.

Hereafter, embodiments according to the present invention will be described; however, the present invention is not limited to these.

A resin composition according to the present embodiment contains a modified polyphenylene ether having, at a terminal, a group represented by a formula (1) given below, a radical-polymerizable compound, a styrene-based thermoplastic elastomer, and an organic peroxide.

First, the modified polyphenylene ether used in the present embodiment is not particularly limited as long as it is a polyphenylene ether having, at a terminal, a group represented by the formula (1) given below.

[Formula 2]

(1)

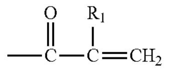

In the formula (1), $R_1$ represents a hydrogen atom or an alkyl group. Also, the alkyl group is not particularly limited, and is preferably, for example, an alkyl group having 1 to 18 carbon atoms, more preferably an alkyl group having 1 to 10 carbon atoms. Specific examples of the alkyl group include methyl group, ethyl group, propyl group, hexyl group, and decyl group.

Examples of the group represented by the aforementioned formula (1) include acrylate group and methacrylate group.

Also, the modified polyphenylene ether according to the present embodiment has a polyphenylene ether chain in a molecule, and preferably has, for example, the repeating units represented by the following formula (2) in a molecule.

[Formula 3]

(2)

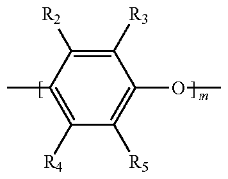

Also, in the formula (2), m represents 1 to 50. Further, $R_2$ to $R_5$ are each independent. That is, $R_2$ to $R_5$ may be the same group or different groups. Also, $R_2$ to $R_5$ each represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Each of the functional groups mentioned in $R_2$ to $R_5$ may be, for example, the following ones.

The alkyl group, though not particularly limited, is preferably, for example, an alkyl group having 1 to 18 carbon atoms, more preferably an alkyl group having 1 to 10 carbon atoms. Specific examples of the alkyl group include methyl group, ethyl group, propyl group, hexyl group, and decyl group.

The alkenyl group, though not particularly limited, is preferably, for example, an alkenyl group having 2 to 18 carbon atoms, more preferably an alkenyl group having 2 to 10 carbon atoms. Specific examples of the alkenyl group include vinyl group, allyl group, and 3-butenyl group.

The alkynyl group, though not particularly limited, is preferably, for example, an alkynyl group having 2 to 18 carbon atoms, more preferably an alkynyl group having 2 to 10 carbon atoms. Specific examples of the alkynyl group include ethynyl group and prop-2-yn-l-yl group (propargyl group).

Also, the alkylcarbonyl group is not particularly limited as long as it is a carbonyl group substituted by an alkyl group, and is preferably, for example, an alkylcarbonyl group having 2 to 18 carbon atoms, more preferably an alkylcarbonyl group having 2 to 10 carbon atoms. Specific examples of the alkylcarbonyl group include acetyl group, propionyl group, butyryl group, isobutyryl group, pivaloyl group, hexanoyl group, octanoyl group, and cyclohexylcarbonyl group.

Also, the alkenylcarbonyl group is not particularly limited as long as it is a carbonyl group substituted by an alkenyl group, and is preferably, for example, an alkenylcarbonyl group having 3 to 18 carbon atoms, more preferably an alkenylcarbonyl group having 3 to 10 carbon atoms. Specific examples of the alkenylcarbonyl group include acryloyl group, methacryloyl group, and crotonoyl group.

Also, the alkynylcarbonyl group is not particularly limited as long as it is a carbonyl group substituted by an alkynyl group, and is preferably, for example, an alkynylcarbonyl group having 3 to 18 carbon atoms, more preferably an alkynylcarbonyl group having 3 to 10 carbon atoms. Specific examples of the alkynylcarbonyl group include propioloyl group.

The modified polyphenylene ether according to the present embodiment may be, for example, one having a group represented by the above formula (1) at a terminal of a polyphenylene ether represented by the following formula (3) or (4). Specific examples of the modified polyphenylene ether include a modified polyphenylene ether represented by the following formula (5) or (6).

1 to 10 carbon atoms. Specific examples of the alkyl group include methyl group, ethyl group, propyl group, hexyl group, and decyl group.

The weight average molecular weight (Mw) of the modified polyphenylene ether used in the present embodiment is not particularly limited. Specifically, the weight average molecular weight is preferably 500 to 5000, more preferably 800 to 4000, and still more preferably 1000 to 3000. Here, the weight average molecular weight may be one measured by a general molecular weight measurement method and may be specifically, for example, a value measured by using gel permeation chromatography (GPC) or the like. Further,

[Formula 4]

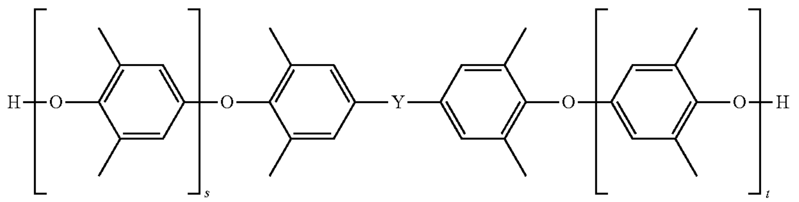

(3)

[Formula 5]

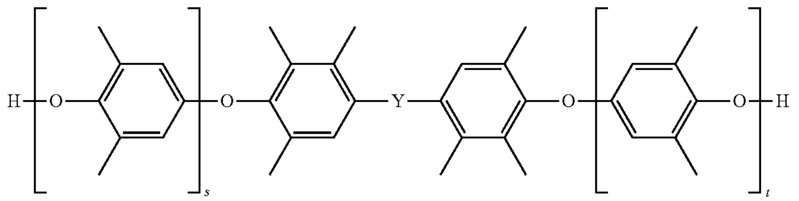

(4)

[Formula 6]

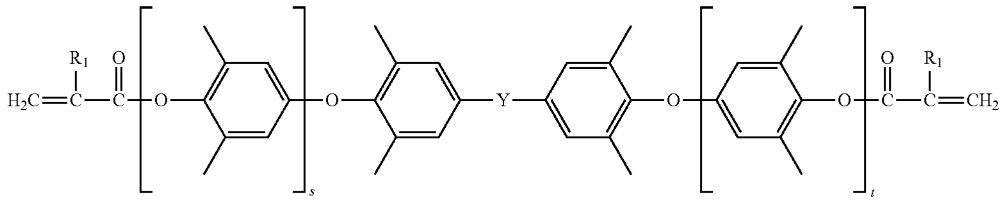

(5)

[Formula 7]

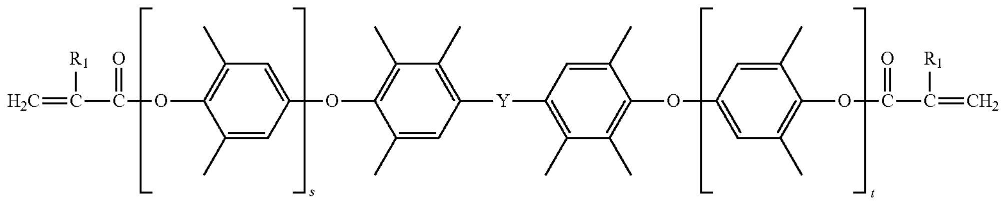

(6)

In the formulas (3) to (6), s and t are preferably, for example, such that a sum value of s and t is 1 to 30. Also, s is preferably 0 to 20, and t is preferably 0 to 20. In other words, it is preferable that s is 0 to 20; t is 0 to 20; and a sum of s and t is 1 to 30. Further, Y represents an alkylene group having 1 to 3 carbon atoms or a direct bond, and examples of the alkylene group include dimethylmethylene group. Also, in the formulas (5) and (6), $R_1$ is the same as $R_1$ in the above formula (1), and represent a hydrogen atom or an alkyl group. Further, the alkyl group is not particularly limited and is preferably, for example, an alkyl group having 1 to 18 carbon atoms, more preferably an alkyl group having when the modified polyphenylene ether has, in a molecule, repeating units represented by the formula (2), m is preferably a numerical value such that the weight average molecular weight of the modified polyphenylene ether comes to be within such a range. Specifically, m is preferably 1 to 50.

When the weight average molecular weight of the modified polyphenylene ether is within such a range, the cured product has, the excellent dielectric properties that a polyphenylene ether has, and is excellent in moldability as well as in heat resistance. This seems to be due to the following reason. A typical polyphenylene ether, when the weight average molecular weight thereof is within such a range, is one having a comparatively low molecular weight, so that the heat resistance of the cured product tends to decrease. In this respect, it seems that, since the modified polyphenylene ether according to the present embodiment has a group represented by the above formula (1) at a terminal, a cured product having a sufficiently high heat resistance can be obtained. Also, when the weight average molecular weight of the modified polyphenylene ether is within such a range, the cured product is excellent in moldability as well because of having a comparatively low molecular weight. Accordingly, it seems that, with such a modified polyphenylene ether, a cured product being excellent not only in heat resistance but also in moldability can be obtained.

The average number of groups represented by the above formula (1) that the modified polyphenylene ether used in the present embodiment has at molecular terminals per one molecule of the modified polyphenylene ether (number of terminal functional groups) is not particularly limited. Specifically, the number of terminal functional groups is preferably 1 to 5, more preferably 1 to 3, and still more preferably 1.5 to 3. When the number of terminal functional groups is too small, there is a tendency such that a cured product having a sufficient heat resistance can hardly be obtained. Also, when the number of terminal functional groups is too large, the reactivity tends to be too high, thereby generating an inconvenience such that, for example, the storage property of the resin composition may decrease, or the fluidity of the resin composition may decrease. In other words, when such a modified polyphenylene ether is used, for example, poor molding such as generation of voids in forming a multiple layer may be generated due to insufficient fluidity or the like, thereby generating a problem in moldability such that a printed wiring board having a high reliability can hardly be obtained.

Here, the number of terminal functional groups in the modified polyphenylene ether may be, for example, a numerical value of the like representing an average value of the groups represented by the above formula (1) per one molecule of all the modified polyphenylene ether that is present in one mole of the modified polyphenylene ether. The number of terminal functional groups can be determined, for example, by measuring the number of hydroxyl groups that remain in the obtained modified polyphenylene ether and calculating the amount of decrease in the number of hydroxyl groups as compared with the polyphenylene ether before modification. The amount of decrease in the number of hydroxyl groups as compared with the polyphenylene ether before modification is the number of terminal functional groups. Further, as a measurement method, the number of hydroxyl groups that remain in the modified polyphenylene ether can be determined by adding a quaternary ammonium salt that associates with hydroxyl groups (tetraethylammonium hydroxide) into a solution of the modified polyphenylene ether and measuring the UV absorbance of the mixed solution.

Also, the intrinsic viscosity of the modified polyphenylene ether used in the present embodiment is not particularly limited. Specifically, the intrinsic viscosity is preferably 0.03 to 0.12 dl/g, more preferably 0.04 to 0.11 dl/g, and still more preferably 0.06 to 0.095 dl/g. When the intrinsic viscosity is too low, the molecular weight tends to be low, thereby generating a tendency such that low dielectric properties such as low dielectric constant or low dielectric loss tangent can hardly be obtained. On the other hand, when the intrinsic viscosity is too high, the viscosity is high, and sufficient fluidity cannot be obtained, so that the moldability of the cured product tends to decrease. Accordingly, when the intrinsic viscosity of the modified polyphenylene ether is within the aforementioned range, excellent heat resistance and moldability of the cured product can be attained.

Here, the intrinsic viscosity herein referred to is an intrinsic viscosity as measured in methylene chloride of 25° C., and more specifically is a value or the like obtained by measuring a methylene chloride solution of 0.18 g/45 ml (liquid temperature of 25° C.) with a viscometer. The viscometer may be, for example, an AVS500 Visco System or the like manufactured by Schott AG.

Also, a method of synthesizing a modified polyphenylene ether used in the present embodiment is not particularly limited as long as a modified polyphenylene ether having a group represented by the above formula (1) at a terminal can be synthesized.

The radical-polymerizable compound used in the present embodiment is not particularly limited as long as it is a radical-polymerizable compound having, only at molecular terminals, two or more bonds or groups of at least one selected from the group consisting of a carbon-carbon unsaturated double bond and a maleimide group. In other words, this radical-polymerizable compound is a radical-polymerizable compound that has, only at molecular terminals, two or more bonds or groups of at least one selected from the group consisting of a carbon-carbon unsaturated double bond and a maleimide group and that does not have a carbon-carbon unsaturated double bond such as a vinylene group in the molecule other than at the molecular terminals. Also, examples of the carbon-carbon unsaturated double bond include double bonds contained in allyl group, vinyl group, acrylate group, methacrylate group, and maleimide group. In other words, the radical-polymerizable compound may be, for example, a radical-polymerizable compound or the like having, only at molecular terminals, two or more functional groups such as ally group, vinyl group, acrylate group, methacrylate group, or maleimide group. It is sufficient that the radical-polymerizable compound is one such that the functional groups can react with the modified polyphenylene ether to form cross-linking for curing. Also, the resin composition according to the present embodiment may contain a radical-polymerizable compound other than the aforementioned radical-polymerizable compound as long as the aforementioned radical-polymerizable compound is contained.

Specific examples of the aforementioned radical-polymerizable compound include a polyfunctional allyl compound having two or more allyl groups at only molecular terminals, such as triallyl isocyanurate (TAIC), a polyfunctional methacrylate compound having two or more methacrylate groups at only molecular terminals, such as trimethylolpropane trimethacrylate (TMPT), a polyfunctional acrylate compound having two or more acrylate groups at only molecular terminals, a vinylbenzyl compound having a vinylbenzyl group in a molecule, such as divinylbenzene (DVB), and a polyfunctional maleimide compound having two or more maleimide groups at only molecular terminals. Also, as the radical-polymerizable compound, those exemplified above may be used either alone or in combination of two or more kinds.

Further, the weight average molecular weight of the radical-polymerizable compound is preferably 100 to 5000, more preferably 100 to 4000, and still more preferably 100 to 3000. When the weight average molecular weight of the radical-polymerizable compound is too low, the radical-polymerizable compound may be liable to be volatilized from the blended component system of the resin composition. On the other hand, when the weight average molecular weight of the radical-polymerizable compound is too high, the viscosity of the varnish of the resin composition or the melt viscosity at the time of heated molding may become too high. Accordingly, when the weight average molecular weight of the radical-polymerizable compound is within such a range, a resin composition having a more excellent heat resistance of the cured product can be obtained. This seems to be because cross-linking can be suitably formed by reaction with the modified polyphenylene ether. Here, the weight average molecular weight may be one measured by a general molecular weight measurement method and may be specifically, for example, a value measured by using gel permeation chromatography (GPC) or the like.

Further, in the radical-polymerizable compound, the average number of groups (number of terminal functional groups) of at least one selected from the group consisting of allyl group, vinyl group, acrylate group, methacrylate group, and maleimide group per one molecule of the radical-polymerizable compound, is 2 or more as mentioned in the above, preferably 2 to 20, and more preferably 2 to 18. When the number of terminal functional groups is too small, there is a tendency such that a cured product having a sufficient heat resistance can hardly be obtained. On the other hand, when the number of terminal functional groups is too large, the reactivity tends to be too high, thereby raising a possibility of generating an inconvenience such that, for example, the storage property of the resin composition may decrease, or the fluidity of the resin composition may decrease.

Here, the number of terminal functional groups herein referred to can be found from the standard value of a product of the radical-polymerizable compound that is put to use. Specifically, the number of terminal functional groups herein referred to may be, for example, a numerical value or the like representing an average value of the allyl group, vinyl group, acrylate group, methacrylate group, and maleimide group per one molecule of all the radical-polymerizable compound that is present in one mole of the radical-polymerizable compound.

The styrene-based thermoplastic elastomer used in the present embodiment is not particularly limited as long as it is a styrene-based thermoplastic elastomer in which repeating units having a carbon-carbon unsaturated double bond not belonging to an aromatic ring are contained in an amount less than 10 mol % with respect to all repeating units. In other words, the styrene-based thermoplastic elastomer is not particularly limited as long as it is a styrene-based thermoplastic elastomer in which the molar number of carbon-carbon unsaturated double bonds that exclude aromatic rings and that are contained in one mole of the styrene-based thermoplastic elastomer is less than 10 mol %. The molar ratio of the presence (total presence ratio) of carbon-carbon unsaturated double bonds can be calculated, for example, by a method of determining the ratio of repeating units having a carbon-carbon unsaturated double bond not belonging to an aromatic ring with respect to all the repeating units. In the styrene-based thermoplastic elastomer, the ratio of repeating units having a carbon-carbon unsaturated double bond not belonging to an aromatic ring is less than 10 mol %, preferably 0 to 5 mol % or less, and more preferably 0 to 2 mol % or less, with respect to all the repeating units. Also, the amount of the carbon-carbon unsaturated double bonds that exclude aromatic rings and that are contained in the styrene-based thermoplastic elastomer is preferably as small as possible, so that the aforementioned ratio is still more preferably 0 mol %.

Also, the carbon-carbon unsaturated double bonds contained in the styrene-based thermoplastic elastomer include not only the carbon-carbon unsaturated double bonds that are present at molecular terminals but also the carbon-carbon unsaturated double bonds that are contained in the molecular chain. In other words, the repeating units having a carbon-carbon unsaturated double bond not belonging to an aromatic ring include the carbon-carbon unsaturated double bonds that are present at molecular terminals and the carbon-carbon unsaturated double bonds that are contained in the molecular chain. Further, in the styrene-based thermoplastic elastomer, the carbon-carbon unsaturated double bonds contained in the molecular chain are preferably smaller in amount in the carbon-carbon unsaturated double bonds not belonging to an aromatic ring, in view of suppressing generation of thermal degradation on the dielectric properties. Specifically, in the styrene-based thermoplastic elastomer, the ratio of repeating units having a carbon-carbon double bond that are contained in the molecular chain among the repeating units having a carbon-carbon unsaturated double bond not belonging to an aromatic ring is preferably less than 3 mol %, more preferably 0 to 2 mol % or less, and still more preferably 0 to 1 mol % or less, with respect to all the repeating units. When a styrene-based thermoplastic elastomer in which the presence ratio of carbon-carbon unsaturated double bonds in the molecular chain (presence ratio in molecular chain) is within the aforementioned range is used, generation of thermal degradation on the dielectric properties can be further more suppressed. Also, the carbon-carbon unsaturated double bonds that exclude aromatic rings and that are contained in the molecular chain may be, for example, vinylene groups or the like.

The styrene-based thermoplastic elastomer may be, for example, a hydrogenated styrene-based thermoplastic elastomer, and more specifically may be a styrene-based thermoplastic elastomer or the like that has been subjected to hydrogenation (addition of hydrogen) so that the content ratio of repeating units having a carbon-carbon unsaturated double bond is less than 10 mol % with respect to all the repeating units. Further, examples of the styrene-based thermoplastic elastomer include a hydrogenated methylstyrene (ethylene/butylene) methylstyrene copolymer, a hydrogenated methylstyrene (ethylene-ethylene/propylene) methylstyrene copolymer, hydrogenated styrene isoprene copolymer, a hydrogenated styrene isoprene styrene copolymer, a hydrogenated styrene (ethylene/butylene) styrene copolymer, and a hydrogenated styrene (ethylene-ethylene/propylene) styrene copolymer. Also, as the styrene-based thermoplastic elastomer, those exemplified above may be used either alone or in combination of two or more kinds.

Also, the hydrogenated methylstyrene (ethylene/butylene) methylstyrene copolymer may be, for example, one which has repeating units represented by the following formulas (7) to (9) in a molecule and in which the ratio of a:b:c is 29:42:29, or the like. This hydrogenated methylstyrene (ethylene/butylene) methylstyrene copolymer does not contain repeating units having a carbon-carbon unsaturated double bond not belonging to an aromatic ring, so that the content ratio of the repeating units having a carbon-carbon unsaturated double bond not belonging to an aromatic ring is 0 mol %.

Also, the hydrogenated styrene isoprene, styrene copolymer may be, for example, one which has repeating units represented by the following formulas (10) to (12) and (14) to (16) in a molecule and in which the ratio of d:e:f:h:i:j is 20:4:3:19:5:49, or the like. In this hydrogenated styrene isoprene styrene copolymer, the content ratio (total presence ratio) of repeating units having a carbon-carbon unsaturated double bond not belonging to an aromatic ring is 7 mol % [=(4+3)/(20+4+3+19+5+49)×100] with respect to all the repeating units. Further, in this hydrogenated styrene isoprene styrene copolymer, the content ratio (presence ratio in molecular chain) of repeating units having a carbon-carbon unsaturated double bond that exclude aromatic rings and that are contained in the molecular chain is 4 mol % [=4/(20+4+3+19+5+49)×100] with respect to all the repeating units.

Also, the hydrogenated styrene (ethylene butylene) styrene copolymer may be, for example, one which has repeating units represented by the following formulas (8) to (10), (17), and (18) in a molecule and in which the ratio of b:c:d:k:l is 51:28:18:2:1, or the like. In this hydrogenated styrene isoprene styrene copolymer, the content ratio (total presence ratio) of repeating units having a carbon-carbon unsaturated double bond not belonging to an aromatic ring is 3 mol % [=(2+1)/(51+28+18+2+1)×100] with respect to all the repeating units. Further, in this hydrogenated styrene isoprene styrene copolymer, the content ratio (presence ratio in molecular chain) of repeating units having a carbon-carbon unsaturated double bond that exclude aromatic rings and that are contained in the molecular chain is 2 mol % [=2/(51+28+18+2+1)×100] with respect to all the repeating units.

Further, this hydrogenated styrene isoprene styrene copolymer may be, for example, one obtained by hydrogenation of a styrene isoprene styrene copolymer having repeating units represented by the following formulas (10) to (13) in a molecule. Here, in the case of a styrene isoprene styrene copolymer having repeating units represented by the following formulas (10) to (13) in a molecule, when, for example, the ratio of d:e:f:g is 21:20:10:49, the content ratio of repeating units having a carbon-carbon unsaturated double bond not belonging to an aromatic ring is 79 mol % [=(20+10+49)/(21+20+10+49)×100] with respect to all the repeating units and exceeds 10 mol %.

[Formula 8]

(7)

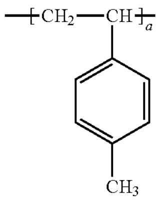

[Formula 9]

(8)

$-\!\!+CH_2-CH_2-CH_2-CH_2+_b\!\!-$

[Formula 10]

(9)

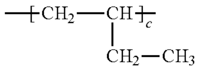

[Formula 11]

(10)

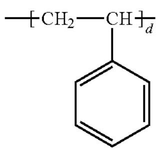

-continued

[Formula 12]

(11)

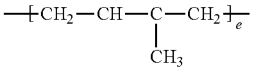

[Formula 13]

(12)

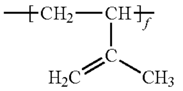

[Formula 14]

(13)

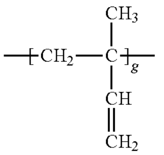

[Formula 15]

(14)

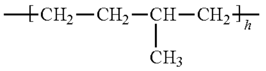

[Formula 16]

(15)

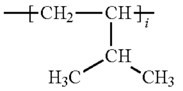

[Formula 17]

(16)

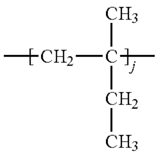

[Formula 18]

(17)

$-\!\!+CH_2-CH=CH-CH_2+_k\!\!-$

[Formula 19]

(18)

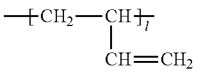

Further, the styrene-based thermoplastic elastomer preferably has a weight average molecular weight of 10000 to 300000, more preferably 50000 to 250000, and still more preferably 60000 to 200000. When the weight average molecular weight of the styrene-based thermoplastic elastomer is too small, there is a tendency such that the glass transition temperature of the cured product may decrease, or the heat resistance of the cured product may decrease. On the other hand, when the weight average molecular weight of the styrene-based thermoplastic elastomer is too large, the viscosity of the varnish of the resin composition or the melt viscosity at the time of heated molding may become too high. Accordingly, when the, weight average molecular weight of the styrene-based thermoplastic elastomer is within the aforementioned range, the cured product is more excellent in glass transition temperature and heat resistance, and generation of thermal degradation on the dielectric properties can be further more suppressed.

Also, the content of the modified polyphenylene ether is preferably 20 to 80 parts by mass, more preferably 30 to 70 parts by mass, with respect to 100 parts by mass of a sum of the modified polyphenylene ether, the radical-polymerizable compound, and the styrene-based elastomer.

Further, the content of the radical-polymerizable compound is preferably 10 to 50 parts by mass, more preferably 20 to 40 parts by mass, with respect to 100 parts by mass of a sum of the modified polyphenylene ether, the radical-polymerizable compound, and the styrene-based elastomer.

When one of the content of the modified polyphenylene ether and the content of the radical-polymerizable compound is too small or too large, there is a tendency such that a suitable cured product may not be obtained. Specifically, the ratio of the content of the modified polyphenylene ether to the content of the radical-polymerizable compound is preferably 50:50 to 90:10 in mass ratio. When the content of the modified polyphenylene ether is too small, there is a tendency such that the excellent dielectric properties that the polyphenylene ether has may not be sufficiently exhibited. On the other hand, when the content of the modified polyphenylene ether is too large, the glass transition temperature of the cured product tends to decrease. Accordingly, when the content of the modified polyphenylene ether and the content of the radical-polymerizable compound are respectively within the aforementioned ranges, a curing reaction of the modified polyphenylene ether and the radical-polymerizable compound proceeds suitably, whereby a cured product being excellent in dielectric properties and having a high glass transition temperature can be obtained.

Further, the content of the styrene-based elastomer is preferably 5 to 60 parts by mass, more preferably 5 to 50 parts by mass, with respect to 100 parts by mass of a sum of the modified polyphenylene ether, the radical-polymerizable compound, and the styrene-based elastomer. In other words, the ratio of a sum of the content of the modified polyphenylene ether and the content of the radical-polymerizable compound to the content of the styrene-based elastomer is preferably 40:60 to 95:5, more preferably 50:50 to 95:5, in mass ratio. When the content of the styrene-based elastomer is too small, there is a tendency such that the effect of enhancing the dielectric properties may not be sufficiently produced. On the other hand, when the content of the styrene-based elastomer is too large, the viscosity of the resin composition becomes high, and properties of impregnation into the fibrous base member and the like tend to decrease. Also, the styrene-based elastomer has a low content ratio of the repeating units having a carbon-carbon unsaturated double bond as described above, so that, even when the content of the styrene-based elastomer is within the aforementioned range, generation of thermal degradation on the dielectric properties can be sufficiently suppressed. Furthermore, when the styrene-based elastomer has a low content ratio of repeating units having carbon-carbon unsaturated double bonds that exclude aromatic rings and that are contained in the molecular chain, for example, repeating units having vinylene groups, generation of thermal degradation on the dielectric properties can be further more suppressed. Accordingly, when the content of the styrene-based elastomer is within the aforementioned range, a cured product being excellent in dielectric properties with sufficiently suppressed generation of thermal degradation on the dielectric properties can be obtained, and furthermore, a resin composition excellent in the properties of impregnation into the fibrous base member and the like can be obtained.

The organic peroxide used in the present embodiment is not particularly limited. The organic peroxide can promote the curing reaction of the modified polyphenylene, ether and the radical-polymerizable compound. Examples of the organic peroxide include α,α'-bis(t-butylperoxy-m-isopropyl) benzene, dicumylperoxide, 2,5-dimethyl-2,5-di(t-butylperoxy)hexane, di-t-butylperoxide, 2,5-dimethyl-2,5-di(t-butylperoxy)-3-hexyne, benzoyl peroxide, 3,3'-5,5'-tetramethyl-1,4-diphenoquinone, chloranyl, 2,4,6-tri-t-butylphenoxyl, t-butylperoxyisopropyl monocarbonate, and azobisisobutyronitrile. As the aforementioned organic peroxide, dialkyl-based organic peroxides are preferable in view of the reaction starting temperature and, among the above exemplified ones, α,α'-bis(t-butylperoxy-m-isopropyl)benzene is preferably used. Since α,α'-bis(t-butylperoxy-m-isopropyl)benzene has a comparatively high reaction starting temperature, promotion of the curing reaction at the time point at which there is no need to cure, such as at the time point of prepreg drying, can be suppressed. By suppression of the curing reaction, decrease in the storage property of the resin composition can be suppressed. Further, because of having a low volatility, α,α'-bis(t-butylperoxy-m-isopropyl)benzene is not volatilized at the time of prepreg drying or storage, so that the stability is good. The organic peroxides may be used either alone or in combination of two or more kinds.

Also, the content of the organic peroxide is preferably 0.1 to 10 parts by mass, more preferably 0.5 to 2 parts by mass, with respect to 100 parts by mass of a sum of the modified polyphenylene ether, the radical-polyrnerizable compound, and the styrene-based elastomer. When the content of the organic peroxide is too small, there is a tendency such that the effect of incorporating the organic peroxide may not be sufficiently exhibited. On the other hand, when the content of the organic peroxide is too large, the dielectric properties and the heat resistance of the obtained cured product tend to receive adverse effects.

Also, the resin composition according to the present embodiment may contain a flame retardant. The flame retardant can enhance the flame retardation property of the cured product of the resin composition. The flame retardant is not particularly limited. Specifically, in the field of using a halogen-based flame retardant such as a bromine-based flame retardant, for example, ethylenedipentabromobenzene, ethylenebistetrabromoimide, decabromodiphenyl oxide, and tetradecabromodiphenoxybenzene having a melting point of 300° C. or higher are preferable. It seems that, by using a halogen-based flame retardant, elimination of halogen at a high-temperature time can be suppressed, and decrease in the heat resistance can be suppressed. Also, in the field where halogen-freeness is required, examples of the flame retardant include phosphate-based flame retardants, phosphazene-based flame retardants, bisdiphenylphosphine oxide-based flame retardants, and phosphinate-based flame retardants. Specific examples of the phosphate-based flame retardants include condensed phosphate of dixylenyl phosphate. Specific examples of the phosphazene-based flame retardants include phenoxyphosphazene. Specific examples of the bisdiphenylphosphine oxide-based flame retardants include xylylenebisdiphenylphosphine oxide. Specific examples of the phosphinate-based flame retardants include phosphinic acid metal salt of aluminum dialkylphosphinate. The flame retardants may be used either alone or in combination of two or more kinds.

Also, the resin composition according to the present embodiment may further contain, for example, additives such as a silane coupling agent, a defoaming agent, an antioxidant, a thermal stabilizer, an antistatic agent, an ultraviolet absorber, a dye or pigment, a lubricant, and an inorganic filler in accordance with the needs and within a range that does not deteriorate the effects of the present invention. In particular, the silane coupling agent is advantageously used for improvement of adhesion to a metal foil or adhesion between the resins, and is preferably a coupling agent having a carbon-carbon unsaturated double bond.

Further, by using the resin composition according to the present embodiment, a prepreg, a metal-clad laminate, and a wiring board can be obtained in the following manner.

FIG. 1 is a schematic sectional view showing one example of a prepreg 1 according to an embodiment of the present invention.

Referring to FIG. 1, the prepreg 1 according to the present embodiment includes the aforementioned resin composition or a semi-cured product 2 of the resin composition, and a fibrous base member 3. The prepreg 1 may be one in which the fibrous base member 3 is present in the semi-cured product 2. In other words, the prepreg 1 includes the semi-cured product 2 and the fibrous base member 3 that is present in the semi-cured product 2.

Here, the semi-cured product refers to one that is in a state in which the resin composition is half-cured to such an extent that further curing can be made. In other words, the semi-cured product is one in a state in which the resin composition is half-cured (turned into a B-stage). For example, when the resin composition is heated, first, the viscosity gradually decreases, and thereafter, the curing starts, and the viscosity gradually increases. In such a case, the semi-cured state may be, for example, a state between the start of increase in the viscosity and the completion of curing.

Also, the prepreg obtained by using the resin composition according to the present embodiment may be one provided with the semi-cured product of the resin composition as described above or one provided with the resin composition that is in a state before being cured. In other words, the prepreg may be a prepreg including the semi-cured product of the resin composition (the resin composition at the B-stage) and a fibrous base member, or may be a prepreg including the resin composition that is in a state before being cured (the resin composition at an A-stage) and a fibrous base member. Specifically, the prepreg may be one in which the fibrous base member is present in the resin composition.

In producing the prepreg, the resin composition 2 is often used by being prepared in a varnish form in order that the fibrous base member 3, which is a base member for forming the prepreg, may be impregnated with the resin composition 2. That is, the resin composition 2 is typically a resin varnish prepared in a varnish form. Such a resin varnish is prepared, for example, in the following manner.

First, components dissoluble in an organic solvent, such as a modified polyphenylene ether, a radical-polymerizable compound, a styrene-based thermoplastic elastomer, and an organic peroxide, are put into the organic solvent and dissolved. During this, heating may be carried out in accordance with the needs. Also, it is preferable that, after the styrene-based thermoplastic elastomer is dissolved into the organic solvent, the radical-polymerizable compound and the modified polyphenylene ether are then dissolved in this order, in view of adjusting the varnish viscosity. Thereafter, components that are not dissolved in the organic solvent, such as an inorganic filler, which are used in accordance with the needs, are added and dispersed to attain a predetermined dispersion state with use of a ball mill, a bead mill, a planetary mixer, a roll mill, or the like, thereby to prepare a composition having a varnish form. The organic solvent used in this process is not particularly limited as long as the organic solvent dissolves the modified polyphenylene ether, radical-polymerizable compound, styrene-based thermoplastic elastomer, organic peroxide, and the like and does not inhibit the curing reaction. Specific examples of the organic solvent include toluene and methyl ethyl ketone (MEK).

A method of producing the prepreg 1 may be, for example, a method of impregnating the fibrous base member 3 with the resin composition 2, for example, the resin composition 2 prepared in a varnish form, followed by drying.

Specific examples of the fibrous base member 3 used in producing the prepreg 1 include glass cloth, aramid cloth, polyester cloth, glass nonwoven cloth, aramid nonwoven cloth, polyester nonwoven cloth, pulp paper, and linter paper. Here, when glass cloth is used, a laminate excellent in mechanical strength can be obtained, and in particular, a glass cloth subjected to a flattening process is preferable. The flattening process may be specifically, for example, a method of continuously pressing the glass cloth under a suitable pressure with a press roll and compressing the yarn into a flattened shape. Here, the thickness of the fibrous base member typically put to use may be, for example, 0.02 mm or more and 0.3 mm or less.

The fibrous base member 3 is impregnated with the resin composition 2 by immersion, application, or the like. The impregnation can be carried out by repetition for a plurality of times in accordance with the needs. Also, during, this, the impregnation may be repeated with use of a plurality of resin compositions that are different in composition or concentration, thereby to adjust the composition and the impregnation amount to those eventually desired.

The fibrous base member 3 impregnated with the resin composition 2 is heated under desired heating conditions, for example, at 80° C. or higher and 180° C. or lower for 1 minute or more and 10 minutes or less. The heating gives a prepreg 1 in a semi-cured state (B-stage).

The resin composition according to the present embodiment is excellent in dielectric properties with sufficiently suppressed generation of thermal, degradation on the dielectric properties. For this reason, a prepreg obtained by using this resin composition is excellent in dielectric properties with sufficiently suppressed generation of thermal degradation on the dielectric properties. Further, this prepreg is a prepreg with which it is possible to produce a metal-clad laminate that is excellent in dielectric properties with sufficiently suppressed generation of thermal degradation on the dielectric properties.

Figure 2:
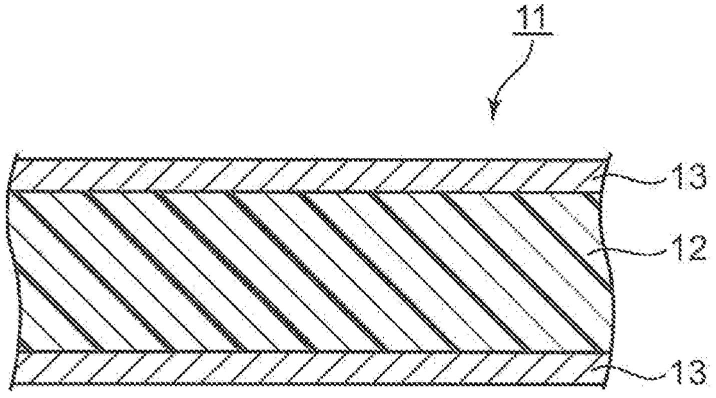
FIG. 2 is a schematic sectional view showing one example of a metal-clad laminate according to an embodiment of the present invention.

FIG. 2 is a schematic sectional view showing one example of a metal-clad laminate 11 according to an embodiment of the present invention.

Referring to FIG. 2, the metal-clad laminate 11 is configured from an insulating layer 12 containing a cured product of the prepreg 1 shown in FIG. 1 and a metal foil 13 that is laminated together with the insulating layer 12. In other words, the metal-clad laminate 11 has the metal foil 13 on the insulating layer 12 containing the cured product of the resin composition. Also, the metal-clad laminate 11 has the insulating layer 12 containing the cured product of the resin composition and has the metal foil 13 bonded to the insulating layer 12. Also, the metal-clad laminate 11 has the insulating layer 12 containing the cured product of the resin composition and has the metal foil 13 disposed on the insulating layer 12.

A method of fabricating the metal-clad laminate 11 with use of the prepreg 1 may be, for example, a method of superposing one sheet or a plurality of sheets of the prepreg 1, then further superposing a metal foil 13 such as a copper foil onto one or both of the upper and lower surfaces of the prepreg 1, and performing heated and pressurized molding of the metal foil 13 and the prepreg 1 for lamination and integration, thereby to form a laminate 11 that is clad with a metal foil on one surface or on both surfaces. In other words,, the metal-clad laminate 11 is obtained by laminating a metal foil 13 onto a prepreg 1, followed by heated and pressurized molding. Also, the heating and pressurizing conditions can be suitably set in accordance with the thickness of the metal-clad laminate 11 to be produced, the type of the composition of the prepreg 1, and the like. For example, the temperature can be set to be 150 to 210° C.; the pressure can be set to be 1.5 to 5 MPa; and the time can be set to be 60 to 150 minutes.

Alternatively, the metal-clad laminate 11 may be fabricated without using the prepreg 1, that is, the metal-clad laminate 11 may be fabricated by forming a resin composition having a varnish form on the metal foil 13, followed by heating and pressurizing.

The resin composition according to the present embodiment is excellent in dielectric properties with sufficiently suppressed generation of thermal degradation on the dielectric properties. For this reason, a metal-clad laminate obtained by using this resin composition is excellent in dielectric properties with sufficiently suppressed generation of thermal degradation on the dielectric properties. Further, this metal-clad laminate is a metal-clad laminate with which it is possible to produce a wiring board that is excellent in dielectric properties with sufficiently suppressed generation of thermal degradation on the dielectric properties.

Figure 3:
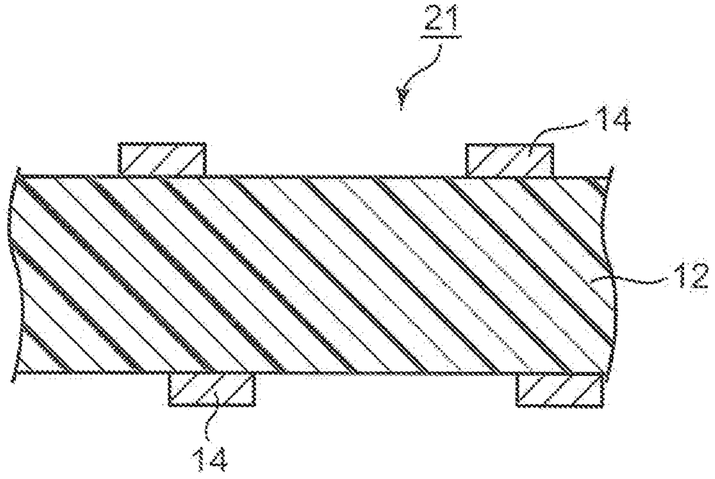
FIG. 3 is a schematic sectional view showing one example of a wiring board according to an embodiment of the present invention.

FIG. 3 is a schematic sectional view showing one example of a wiring board 21 according to an embodiment of the present invention.

Referring to FIG. 3, the wiring board 21 according to the present embodiment is configured from an insulating layer 12 used by curing the prepreg 1 shown in FIG. 1 and a wiring 14 that is laminated together with the insulating layer 12 and formed by partially removing the metal foil 13. In other words, the wiring board 21 has the wiring 14 on the insulating layer 12 containing the cured product of the resin composition. Also, the wiring board 21 has the insulating layer 12 containing the cured product of the resin composition and has the wiring 14 bonded to the insulating layer 12. Also, the wiring board 21 has the insulating, layer 12 containing the cured product of the resin composition and has the wiring 14 disposed on the insulating layer 12.

Further, the metal foil 13 on the surface of the fabricated metal-clad laminate 11 may be subjected to an etching process or the like to form a wiring, thereby producing a wiring board 21 having a wiring provided as a circuit on the surface of the insulating layer 12. In other words, the wiring board 21 is formed by a circuit forming process of partially removing the metal foil 13 on the surface of the metal-clad laminate 11. The wiring board 21 has the insulating layer 12 that is excellent in dielectric properties with sufficiently suppressed generation of thermal degradation on the dielectric properties.

Such a wiring board is a wiring board that is excellent in dielectric properties with sufficiently suppressed generation of thermal degradation on the dielectric properties.

Figure 4:
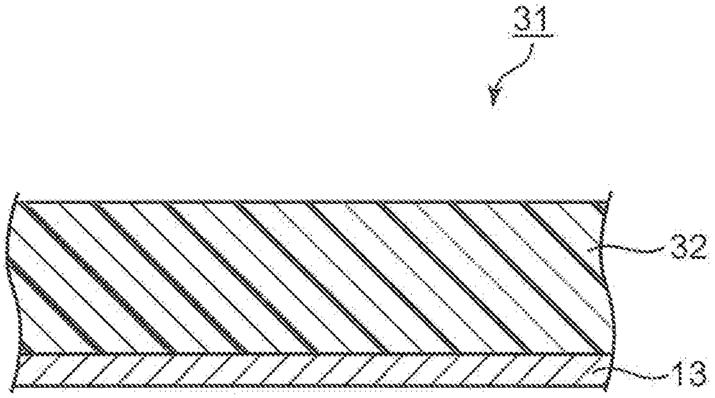
FIG. 4 is a schematic sectional view showing one example of a resin-coated metal foil according to an embodiment of the present invention.

FIG. 4 is a schematic sectional view showing one example of a resin-coated metal foil 31 according to the present embodiment.

Referring, to FIG. 4, the resin-coated metal foil 31 according to the present embodiment includes an insulating layer 32 containing the aforementioned resin composition or a semi-cured product of the resin composition, and a metal foil 13. The resin-coated metal foil 31 has the metal foil 13 on a surface of the insulating layer 32. In other words, the resin-coated metal foil 31 includes the insulating layer 32 and the metal foil 13 that is laminated together with the insulating layer 32. Also, the resin-coated metal foil 31 may include other layers disposed between the insulating layer 32 and the metal foil 13.

Also, the insulating layer 32 may be one including the semi-cured product of the resin composition such as described above or one including the resin composition that is in a state before being cured. In other words, the resin-coated metal foil 31 may include the semi-cured product of the resin composition (the resin composition at the B-stage) and the metal foil, or may include an insulating layer containing the resin composition that is in a state before being cured (the resin composition at the A-stage) and the metal foil. Also, it is sufficient that the insulating layer contains the resin composition or a semi-cured product of the resin composition, so that the fibrous base member may be either contained or not contained. Further, as the fibrous base member, it is possible to use one similar to the fibrous base member of the prepreg.

Also, as the metal foil, it is possible to use a metal foil that is used in a resin-coated metal foil or a metal-clad laminate without any limitation. The metal foil may be, for example, a copper foil, an aluminum foil, or the like.

The resin-coated metal foil 31 is produced, for example, by applying the resin composition having a varnish form onto the metal foil 13 and heating. The resin composition having a varnish form is applied onto the metal foil 13, for example, by using a bar coater. The applied resin composition is heated, for example, under conditions with a temperature of 80° C. or higher and 180° C. or lower for 1 minute or more and 10 minutes or less. The heated resin composition is formed as a not-yet-cured insulating layer 32 on the metal foil 13.

Such a resin-coated metal foil is a resin-coated metal foil that is excellent in dielectric properties with sufficiently suppressed generation of thermal degradation on the dielectric properties. Also, such a resin-coated metal foil can be used in producing a wiring board. For example, a multilayer wiring board can be produced by laminating a resin-coated metal foil on the wiring board. As such a wiring board obtained by using the resin-coated metal foil, a wiring board that is excellent in dielectric properties with sufficiently suppressed generation of thermal degradation on the dielectric properties can be obtained.

Figure 5:
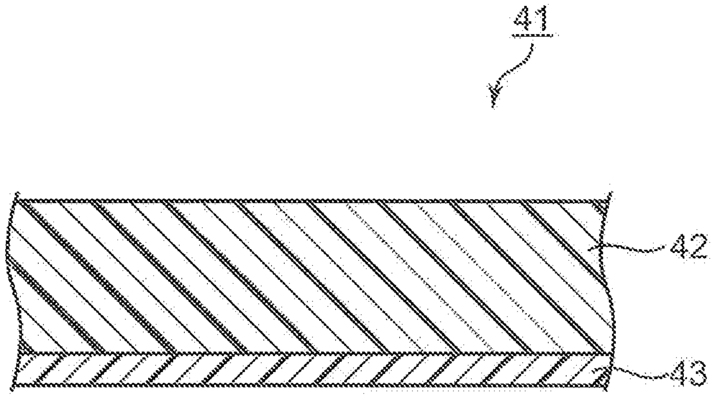
FIG. 5 is a schematic sectional view showing one example of a resin-coated film according to an embodiment of the present invention.

FIG. 5 is a schematic sectional view showing one example of a resin-coated film 41 according to the present embodiment.

Referring to FIG. 5, the resin-coated film 41 according to the present embodiment includes an insulating layer 42 containing the aforementioned resin composition or a semi-cured product of the resin composition, and a support film 43. The resin-coated film 41 has the support film 43 on a surface of the insulating layer 42. In other words, the resin-coated film 41 includes the insulating layer 42 and the support film 43 that is laminated together with the insulating layer 42. Also, the resin-coated film 41 may include other layers disposed between the insulating layer 42 and the support film 43.

Also, the insulating layer 42 may be one including the semi-cured product of the resin composition such as described above or one including the resin composition that is in a state before being cured. In other words, the resin-coated film 41 may include the semi-cured product of the resin composition (the resin composition at the B-stage) and the support film, or may include an insulating layer containing the resin composition that is in a state before being cured (the resin composition at the A-stage) and the support film. Also, it is sufficient that the insulating layer contains the resin composition or a semi-cured product of the resin composition, so that the fibrous base member may be either contained or not contained. Further, as the fibrous base member, it is possible to use one similar to the fibrous base member of the prepreg.

Also, as the support film 43, it is possible to use a support film that is used in a resin-coated film without any limitation. The support film may be, for example, a polyester film, a polyethylene terephthalate film, or the like.

The resin-coated film 41 is produced, for example, by applying the resin composition having a varnish form onto the support film 43 and heating. The resin composition having a varnish form is applied onto the support film 43, for example, by using a bar coater. The applied resin composition is heated, for example, under conditions with a temperature of 80° C. or higher and 180° C. or lower for 1 minute or more and 10 minutes or less. The heated resin composition is formed as a not-yet-cured insulating layer 42 on the support film 43.

Such a resin-coated film is a resin-coated film that is excellent in dielectric properties with sufficiently suppressed generation of thermal degradation on the dielectric properties. Also, such a resin-coated film can be used in producing a wiring board. For example, a multilayer wiring board can be produced by exfoliating the support film after laminating the resin-coated film onto a wiring board or by laminating the resin-coated film onto a wiring board after exfoliating the support film. As such a wiring board obtained by using the resin-coated film, a wiring board that is excellent in dielectric properties with sufficiently suppressed generation of thermal degradation on the dielectric properties can be obtained.

The present specification discloses techniques of various modes as described above, among which principal techniques will be summed up as follows.

One aspect of the present invention is directed to a resin composition containing a modified polyphenylene ether having, at a terminal, a group represented by a formula (1) given below; a radical-polymerizable compound having, only at molecular terminals, two or more bonds or groups of at least one selected from the group consisting of a carbon-carbon unsaturated double bond and a maleimide group; a styrene-based thermoplastic elastomer in which repeating units having a carbon-carbon unsaturated double bond not belonging to an aromatic ring are contained in an amount less than 10 mol % with respect to all the repeating units; and an organic peroxide.

[Formula 20]

(1)

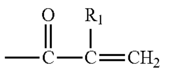

In the formula (1), $R_1$ represents a hydrogen atom or an alkyl group.

Such a configuration can provide a resin composition with which it is possible to obtain a cured product that is excellent in dielectric properties with sufficiently suppressed generation of thermal degradation on the dielectric properties.

This seems to be due to the following reason. First, by cross-linking the modified polyphenylene ether with the radical-polymerizable compound, the resin composition seems to give a cured product maintaining the excellent dielectric properties that the polyphenylene ether has. Also, since the resin composition contains the styrene-based thermoplastic elastomer, the resin composition seems to give a cured product that is more excellent in dielectric properties. Also, the radical-polymerizable compound includes a radical-polymerizable compound having, only at molecular terminals, two or more bonds or groups of at least one selected from the group consisting of a carbon-carbon unsaturated double bond and a maleimide group. It seems that, in such a radical-polymerizable compound, the content of double bonds other than the double bonds contributing to cross-linking of the modified polyphenylene ether is small. Also, in the styrene-based thermoplastic elastomer, repeating units having a carbon-carbon unsaturated double bond not belonging to an aromatic ring are contained in an amount less than 10 mol % with respect to all the repeating units, so that the styrene-based thermoplastic elastomer also has a small content of double bonds. It seems that, in a double bond, by heat, the hydrogen bonded particularly to the α-position carbon thereof is drawn out by a radical, and the double bond is oxidized into a carbonyl group or the like having polarity, thereby causing degradation of electric properties such as dielectric properties. Since the aforementioned resin composition has a smaller content of such double bonds, it seems that the generation of thermal degradation on the dielectric properties can be sufficiently suppressed. From these facts, it seems that the aforementioned resin composition can give a cured product with excellent dielectric properties and furthermore with sufficiently suppressed generation of thermal degradation on the dielectric properties.

Also, in the resin composition, it is preferable that, in the styrene-based thermoplastic elastomer, a ratio of the repeating units having a carbon-carbon unsaturated double bond contained in a molecular chain among the repeating units having a carbon-carbon unsaturated double bond not belonging to an aromatic ring is less than 3 mol % with respect to all the repeating units.

According to such a configuration, the dielectric properties will be excellent, and generation of thermal degradation on the dielectric properties can be further more suppressed.

Also, in the resin composition in which the ratio of the repeating units having a carbon-carbon unsaturated double bond contained in the molecular chain is less than 3 mol % with respect to all the repeating units, the carbon-carbon unsaturated double bond contained in the molecular chain may be, for example, a vinylene group. In other words, in the resin composition, it is more preferable that the ratio of the repeating units having a vinylene group serving as a carbon-carbon unsaturated double bond contained in the molecular chain is less than 3 mol % with respect to all the repeating units, as described above.

In the resin composition, the more the number of vinylene groups contained in the styrene-based thermoplastic elastomer is, the more likely the thermal degradation on the dielectric properties is generated. For this reason, the thermal degradation on the dielectric properties can be further more suppressed when the ratio of the repeating units having a vinylene group serving as a carbon-carbon unsaturated double bond contained in the molecular chain is less than 3 mol % with respect to all the repeating units, as described above. Therefore, according to a configuration such as described above, the dielectric properties will be excellent, and generation of thermal degradation on the dielectric properties can be further more suppressed.

Also, in the resin composition, it is preferable that the radical-polymerizable compound is a radical-polymerizable compound having, only at molecular terminals, two or more groups of at least one selected from the group consisting of allyl group, vinyl group, acrylate group, methacrylate group, and maleimide group.

According to such a configuration, the dielectric properties will be more excellent, and generation of thermal degradation on the dielectric properties can be further more suppressed.

Also, in the resin composition, it is preferable that the modified polyphenylene ether has a weight average molecular weight of 500 to 3000 and has, at a molecular terminal, an average of 1 to 5 groups represented by the formula (1) given above per one molecule.

According to such a configuration, the dielectric properties will be excellent with sufficiently suppressed generation of thermal degradation on the dielectric properties, and furthermore, the heat resistance of the cured product can be enhanced.

Also, in the resin composition, it is preferable that the styrene-based thermoplastic elastomer has a weight average molecular weight of 10000 to 300000.

According to such a configuration, the dielectric properties will be more excellent, and generation of thermal degradation on the dielectric properties can be further more suppressed.

Also, in the resin composition, it is preferable that the styrene-based thermoplastic elastomer is at least one selected from the group consisting of a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, and a hydrogenated styrene (ethylene-ethylene/propylene) styrene copolymer.

According to such a configuration, the dielectric properties will be more excellent, and generation of thermal degradation on the dielectric properties can be further more suppressed.

Also, in the resin composition, it is preferable that a ratio of a sum of the content of the modified polyphenylene ether and the content of the radical-polymerizable compound to the content of the styrene-based thermoplastic elastomer is 50:50 to 95:5 in mass ratio.

According to such a configuration, a cured product with excellent dielectric properties and with sufficiently suppressed generation of thermal degradation on the dielectric properties can be obtained, and furthermore, a resin composition excellent in the properties of impregnation into the fibrous base member and the like can be obtained.

Another aspect of the present invention is, directed to a prepreg including a fibrous base member and the aforementioned resin composition or a semi-cured product of the aforementioned resin composition.

According to such a configuration, a prepreg with excellent dielectric properties and with sufficiently suppressed generation of thermal degradation on the dielectric properties can be obtained.

Another aspect of the present invention is directed to a resin-coated film including a support film and a resin layer containing the aforementioned resin composition or a semi-cured product of the aforementioned resin composition.

According to such a configuration, a resin-coated film with excellent dielectric properties and with sufficiently suppressed generation of thermal degradation on the dielectric properties can be obtained.

Another aspect of the present invention is directed to a resin-coated metal foil including a metal foil and a resin layer containing the aforementioned resin composition or a semi-cured product of the aforementioned resin composition.

According to such a configuration, a resin-coated metal foil with excellent dielectric properties and with sufficiently suppressed generation of thermal degradation on the dielectric properties can be obtained.

Another aspect of the present invention is directed to, a metal-clad laminate including a metal foil and an insulating layer containing a cured product of the aforementioned resin composition.

According to such a configuration, a metal-clad laminate with excellent dielectric properties and with sufficiently suppressed generation of thermal degradation on the dielectric properties can be obtained.

Another aspect of the present invention is directed to a wiring board including a wiring and an insulating layer containing a cured product of the aforementioned resin composition.

According to such a configuration, a wiring board with excellent dielectric properties and with sufficiently suppressed generation of thermal degradation on the dielectric properties can be obtained.

Hereinafter, the present invention will be further more specifically described by way of Examples; however, the scope of the present invention is not limited to these alone.

EXAMPLES

Examples 1 to 8 and Comparative Examples 1 to 6

Each of the components used in preparing the resin composition in the present Examples will be described.

Polyphenylene Ether Compound: PPE Component

Modified PPE-1: modified polyphenylene ether obtained by modifying a terminal hydroxyl group of polyphenylene ether with a methacrylic group (modified polyphenylene ether compound having a structure shown in the formula (5), wherein, in the formula (5), $R_1$ is a methyl group, and Y is a dimethylmethylene group, SA9000 manufactured by SABIC Innovative Plastics Japan LLC, weight average molecular weight Mw being 1700, number of terminal functional groups being 1.8)

Modified PPE-2: modified polyphenylene ether obtained by allowing polyphenylene ether and chloromethylstyrene (vinylbenzyl chloride) to react Specifically, the PPE component is a modified polyphenylene ether obtained by the following reaction.

First, a one-liter three-neck flask equipped with a temperature adjustor, a stirring device, a cooling equipment, and a dropping funnel was loaded with 200 g of polyphenylene ether (SA90 manufactured by SABIC Innovative Plastics Japan LLC, number of terminal hydroxyl groups being 2, weight average molecular weight Mw being 1700), 30 g of a mixture of p-chloromethylstyrene and m-chloromethylstyrene in a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene, followed by stirring. Further, the stirring was carried out until the polyphenylene ether, chloromethylstyrene, and tetra-n-butylammonium bromide were completely dissolved into toluene. During this, heating was gradually carried out, and the heating was carried out until the liquid temperature eventually became 75° C. Further, into the solution, an aqueous solution of sodium hydroxide (20 g of sodium hydroxide/20 g of water) was dropwise added as an alkali metal hydroxide in 20 minutes. Thereafter, stirring was further carried out at 75° C. for 4 hours. Subsequently, after the contents within the flask were neutralized with hydrochloric acid of 10 mass %, a large amount of methanol was put into the flask, thereby to form a precipitate in the liquid within the flask. In other words, the product contained in the reaction liquid within the flask was re-precipitated. Further, this precipitate was taken out by filtration and washed for 3 times with a mixed liquid of methanol and water in a mass ratio of 80:20, followed by drying at 80° C. for 3 hours under reduced pressure.

The obtained solid was analyzed by $^1$H-NMR (400 MHz, $CDCl_3$, TMS). As a result of measuring NMR, a peak deriving from a vinylbenzyl group (ethenylbenzyl group) was confirmed at 5 to 7 ppm. This confirmed that the obtained solid was a modified polyphenylene ether having, in a molecule, a vinylbenzyl group (ethenylbenzyl group) as the substituent at the molecular terminal. It was confirmed that the obtained modified polyphenylene ether compound was specifically an ethenylbenzylated polyphenylene ether.

Also, the number of terminal functional groups of the modified polyphenylene ether was measured in the following manner.

First, the modified polyphenylene ether was weighed precisely. The weight at that time is denoted by X (mg). Further, the weighed modified polyphenylene ether was dissolved into 25 mL of methylene chloride. Into the solution, 100 μL of a 10 mass % ethanol solution of tetraethylammonium hydroxide (TEAH) (TEAH:ethanol (volume ratio)=15:85) was added, followed by measuring the absorbance (Abs) at 318 nm with use of a UV spectrophotometer (UV-1600 manufactured by Shimadzu Corporation). Further, from the measurement results, the number of terminal hydroxyl groups of the modified polyphenylene ether was calculated by using the following formula.

$$\text{Residual OH amount } (\mu mol/g)=[(25\times Abs)/(\varepsilon\times OPL\times X)]\times 10^6$$

Here, ε represents the absorptivity and is 4700 L/mol·cm. Also, OPL is a cell optical path length and is 1 cm.

Further, since the calculated residual OH amount (number of terminal hydroxyl groups) of the modified polyphenylene ether was almost zero, it was found out that the hydroxyl groups of the polyphenylene ether that were present before the modification were almost completely modified. From this, the amount of decrease from the number of terminal hydroxyl groups of the polyphenylene ether before the modification was identical to the number of terminal hydroxyl groups of the polyphenylene ether before the modification. In other words, it was found out that the number of terminal hydroxyl groups of the polyphenylene ether before the modification was the number of terminal functional groups of the modified polyphenylene ether. That is, the number of terminal functional groups was 2.

Also, the intrinsic viscosity (IV) of the modified polyphenylene ether in methylene chloride of 25° C. was measured. Specifically, the intrinsic viscosity (IV) of the modified polyphenylene ether was determined by measuring a 0.18 g/45 ml methylene chloride solution (liquid temperature being 25° C.) of the modified polyphenylene ether with a viscometer (AVS500 Visco System manufactured by Schott AG). As a result, the intrinsic viscosity (IV) of the modified polyphenylene ether was 0.086 dl/g.

Also, the molecular weight distribution of the modified polyphenylene ether was measured by using GPC. Further, from the obtained molecular weight distribution, the weight average molecular weight (Mw) was calculated. As a result, Mw was 1900.

Radical-Polymerizable Compound

- TAIC: triallyl isocyanurate (radical-polymerizable compound having a carbon-carbon unsaturated double bond only at molecular terminals, TAIC manufactured by Nihon Kasei Co., Ltd., weight average molecular weight Mw being 249, number of terminal functional groups being 3)
- DVB: divinylbenzene (radical-polymerizable compound having a carbon-carbon unsaturated double bond only at molecular terminals, DVB-810 manufactured by Nippon Steel & Sumitomo Metal Corporation, molecular weight being 130, number of terminal functional groups being 2)
- TMPT: trimethylolpropane trimethacrylate (radical-polymerizable compound having a carbon-carbon unsaturated double bond only at molecular terminals, TMPT manufactured by Shin-Nakamura Chemical Co., Ltd., molecular weight being 338, number of terminal functional groups being 3)
- BMI-2300: polyphenylmethanemaleimide (radical-polymerizable compound having a maleimide group only at molecular terminals, BMI-2300 manufactured by Daiwakasei Industry Co., Ltd., molecular weight being 670, number of terminal functional groups being 3)
- BMI-TMH: trimethylhexanebismaleimide (radical-polymerizable compound having a maleimide group only at molecular terminals, BMI-TMH manufactured by Daiwakasei Industry Co., Ltd., molecular weight being 318, number of terminal functional groups being 2)
- MIR-3000: biphenylaralkylmaleimide (radical-polymerizable compound having a maleimide group only at molecular terminals, MIR-3000 manufactured by Nippon kayaku Co., Ltd., molecular weight being 875, number of terminal functional groups being 3)
- Styrene butadiene oligomer: styrene butadiene oligomer (radical-polyrmerizable compound having a carbon-carbon unsaturated double bond in a molecule other than at molecular terminals, Ricon181 manufactured by Cray Valley Co., Ltd., content ratio of repeating units having a carbon-carbon unsaturated double bond: 50 mol %)

Styrene-Based Thermoplastic Elastomer

- V9827: hydrogenated methylstyrene (ethylene/butylene) methylstyrene copolymer (SEPTON V9827 manufactured by Kuraray Co., Ltd., copolymer which has repeating units represented by the above formulas (7) to (9) in a molecule and in which the ratio of a:b:c is 29:42:29, content ratio (total presence ratio) of repeating units having a carbon-carbon unsaturated double bond not belonging to an aromatic ring: 0 mol %, content ratio of carbon-carbon unsaturated double bonds (vinylene groups) that exclude aromatic rings and that are contained in the molecular chain (presence ratio in molecular chain): 0 mol %, weight average molecular weight: 92000)

V9461: hydrogenated methylstyrene (ethylene/ethylene propylene) methylstyrene copolymer (SEPTON V9461 manufactured by Kuraray Co., Ltd., total presence ratio: 0 mol %, presence ratio in molecular chain: 0 mol %, weight average molecular weight: 240000)

V9475: hydrogenated methylstyrene (ethylene/ethylene propylene) methylstyrene copolymer (SEPTON V9475 manufactured by Kuraray Co., Ltd., total presence ratio: 0 mol %, presence ratio in molecular chain: 0 mol %, weight average molecular weight: 310000)

2002: hydrogenated styrene (ethylene propylene) styrene copolymer (SEPTON 2002 manufactured by Kuraray Co., Ltd., total presence ratio: 0 mol %, presence ratio in molecular chain: 0 mol %, weight average molecular weight: 54000)

H1041: hydrogenated styrene (ethylene butylene) styrene copolymer (Tuftec H1041 manufactured by Asahi Kasei Corporation, copolymer which has repeating units represented by the above formulas (8) to (10), (17), and (18) in a molecule and in which the ratio of b:c:d:k:l is 51:28:18:2:1, total presence ratio: 3 mol %, presence ratio in molecular chain: 2 mol %, weight average molecular weight: 80000)

7125: hydrogenated styrene isoprene styrene copolymer (HYBRAR 7125 manufactured by Kuraray Co., Ltd., copolymer which has repeating units represented by the above formulas (10) to (12) and (14) to (16) in a molecule and in which the ratio of d:e:f:h:i:j is 20:4:3:19:5:49, total presence ratio: 7 mol %, presence ratio in molecular chain: 4 mol %, weight average molecular weight: 100000)

5127: styrene isoprene styrene copolymer (HYBRAR 5127 manufactured by Kuraray Co., Ltd., copolymer which has repeating units represented by the above formulas (10) to (13) in a molecule and in which the ratio of d:e:f:g is 21:20:10:49, total presence ratio: 79 mol %, presence ratio in molecular chain: 20 mol %, weight average molecular weight: 180000).

Organic Peroxide

PERBUTYL P: 1,3-bis(butylperoxyisopropyl)benzene (PERBUTYL P manufactured by NOF Corporation)

Antioxidant

Antioxidant: 2,6-di-t-butyl-4-methylphenol

Preparation Method

First, the components were added into toluene and mixed in a blending ratio shown in Tables 1 and 2 so that the solid component concentration would be 60 mass %. The mixture was stirred for 60 minutes to obtain a resin composition (varnish) having a varnish form.

Next, after a glass cloth (#2116 type manufactured by Nitto Boseki Co., Ltd.) was impregnated with the obtained varnish, the resultant was heated and dried at 100 to 160° C. for about 2 to 8 minutes to obtain a prepreg. During this process, adjustment was made so that the content (resin content) of the components constituting the resin by a curing reaction, such as a modified polyphenylene ether and a radical-polymerizable compound, and a styrene-based thermoplastic elastomer would be about 50 mass %.

Then, 6 sheets of the obtained prepregs were superposed and laminated while being interposed between copper foils having a thickness of 35 followed by heating and pressurizing under conditions with a temperature of 200° C. for 2 hours under a pressure of 3 MPa to obtain an evaluation substrate having a thickness of about 0.8 mm.

The prepregs and the evaluation substrate prepared as shown above were evaluated by a method shown below.

Glass Transition Temperature (Tg)

The Tg of the prepreg was measured by using a viscoelasticity spectrometer "DMS100" manufactured by Seiko Instruments Inc. During this step, dynamic viscoelasticity measurement (DMA) was carried out with a bending module while setting the frequency to be 10 Hz, and the temperature at which tanδ showed the local maximum when the prepreg was heated from room temperature to 280° C. under conditions with a heating rate of 5° C./minute was determined as the Tg.

Dielectric Properties (Dielectric Loss Tangent)

The dielectric loss tangent of the evaluation substrate at 10 GHz was measured by the cavity resonator perturbation method. Specifically, the dielectric loss tangent of the evaluation substrate at 10 GHz was measured by using a network analyzer (N5230A manufactured by Agilent Technologies Japan, Ltd.)

Thermal Degradation on Dielectric Properties (Heat Resistance Degradation Ratio of Dielectric Loss Tangent)

The evaluation substrate was heated at 130° C. for 2000 hours. Thereafter, the dielectric loss tangent of the evaluation substrate was measured by a method similar to the above one. The rate of change yin the dielectric loss tangent before and after the heating (=dielectric loss tangent measured after heating−dielectric loss tangent measured before heating)/dielectric loss tangent measured before heating×100) was calculated as the heat resistance degradation ratio (%) of the dielectric loss tangent.

The results in each of the aforementioned evaluations are shown in Tables 1 and 2.

TABLE 1

| | | Examples | | | | | | |
|---|---|---|---|---|---|---|---|---|
| | | 1 | 2 | 3 | 4 | 5 | 6 | 7 |
| PPE | modified PPE-1 | 48 | 72 | 63 | 54 | 36 | 24 | 48 |
| | modified PPE-2 | — | — | — | — | — | — | — |
| radical-polymerizable compound | TAIC | 32 | 18 | 27 | 36 | 24 | 16 | — |
| | DVB | — | — | — | — | — | — | 32 |
| | TMPT | — | — | — | — | — | — | — |
| | BMI-2300 | — | — | — | — | — | — | — |

TABLE 1-continued

| | | | | | | | | | | |
|---|---|---|---|---|---|---|---|---|---|---|
| | | BMI-TMH | | — | — | — | — | — | — | — |
| | | MIR-3000 | | — | — | — | — | — | — | — |
| | | styrene butadiene oligomer | | — | — | — | — | — | — | — |
| styrene-based thermoplastic elastomer | V9827 | total presence ratio 0 mol % | presence ratio in molecular chain 0 mol % | 20 | 10 | 10 | 10 | 40 | 60 | 20 |
| organic peroxide | | perbutyl P | | 2 | 2 | 2 | 2 | 2 | 2 | 2 |
| results | | glass transition temperature (° C.) | | 240 | 230 | 240 | 240 | 220 | 190 | 220 |
| | | dielectric loss tangent | | 0.0046 | 0.0049 | 0.0048 | 0.0048 | 0.0042 | 0.004 | 0.0046 |
| | | heat resistance degradation ratio (%) of dielectric loss tangent | | 7 | 14 | 11 | 10 | 12 | 3 | 13 |

| | | | | Examples | | | | Comparative Examples | |
|---|---|---|---|---|---|---|---|---|---|
| | | | | 8 | 9 | 10 | 11 | 1 | 2 |
| PPE | | modified PPE-1 | | 48 | 48 | 48 | 48 | — | 48 |
| | | modified PPE-2 | | — | — | — | — | 48 | — |
| radical-polymerizable compound | | TAIC | | — | — | — | — | 32 | — |
| | | DVB | | — | — | — | — | — | — |
| | | TMPT | | 32 | — | — | — | — | — |
| | | BMI-2300 | | — | 32 | — | — | — | — |
| | | BMI-TMH | | — | — | 32 | — | — | — |
| | | MIR-3000 | | — | — | — | 32 | — | — |
| | | styrene butadiene oligomer | | — | — | — | — | — | 32 |
| styrene-based thermoplastic elastomer | V9827 | total presence ratio 0 mol % | presence ratio in molecular chain 0 mol % | 20 | 20 | 20 | 20 | 20 | 20 |
| organic peroxide | | perbutyl P | | 2 | 2 | 2 | 2 | 2 | 2 |
| results | | glass transition temperature (° C.) | | 230 | 280 | 260 | 270 | 210 | 200 |
| | | dielectric loss tangent | | 0.0048 | 0.005 | 0.0047 | 0.0048 | 0.0046 | 0.0045 |
| | | heat resistance degradation ratio (%) of dielectric loss tangent | | 15 | 6 | 6 | 6 | 59 | 30 |

TABLE 2

| | | | | Examples | | | | |
|---|---|---|---|---|---|---|---|---|
| | | | | 12 | 13 | 14 | 15 | 16 |
| PPE | | modified PPE-1 | | 48 | 48 | 48 | 48 | 48 |
| radical-polymerizable compound | | TAIC | | 32 | 32 | 32 | 32 | 32 |
| styrene-based thermoplastic elastomer | | total presence ratio | presence ratio in molecular chain | | | | | |
| | V9827 | 0 mol % | 0 mol % | — | — | — | — | — |
| | V9461 | 0 mol % | 0 mol % | 20 | — | — | — | — |
| | V9475 | 0 mol % | 0 mol % | — | 20 | — | — | — |
| | 2002 | 0 mol % | 0 mol % | — | — | 20 | — | — |
| | H1041 | 3 mol % | 2 mol % | — | — | — | 20 | — |
| | 7125 | 7 mol % | 4 mol % | — | — | — | — | 20 |
| | 5127 | 79 mol % | 20 mol % | — | — | — | — | — |
| organic peroxide | | perbutyl P | | 2 | 2 | 2 | 2 | 2 |
| | antioxidant | | | — | — | — | — | — |
| results | | glass transition temperature (° C.) | | 240 | 240 | 230 | 240 | 240 |
| | | dielectric loss tangent | | 0.0046 | 0.0046 | 0.0045 | 0.0046 | 0.0046 |
| | | heat resistance degradation ratio (%) of dielectric loss tangent | | 8 | 8 | 7 | 10 | 18 |

| | | | | Examples | Comparative Examples | | | |
|---|---|---|---|---|---|---|---|---|
| | | | | 17 | 3 | 4 | 5 | 6 |
| PPE | | modified PPE-1 | | 48 | 60 | 48 | — | 60 |
| radical-polymerizable compound | | TAIC | | 32 | 40 | 32 | — | 40 |
| styrene-based thermoplastic elastomer | | total presence ratio | presence ratio in molecular chain | | | | | |
| | V9827 | 0 mol % | 0 mol % | 20 | — | — | 100 | — |
| | V9461 | 0 mol % | 0 mol % | — | — | — | — | — |
| | V9475 | 0 mol % | 0 mol % | — | — | — | — | — |

TABLE 2-continued

| | | | | | | | |
|---|---|---|---|---|---|---|---|
| 2002 | 0 mol % | 0 mol % | — | — | — | — | — |
| H1041 | 3 mol % | 2 mol % | — | — | — | — | — |
| 7125 | 7 mol % | 4 mol % | — | — | — | — | — |
| 5127 | 79 mol % | 20 mol % | — | — | 20 | — | — |
| organic peroxide | perbutyl P | | 0.5 | 2 | 2 | 2 | 2 |
| | antioxidant | | — | — | — | — | 0.1 |
| results | glass transition temperature (° C.) | | 220 | 240 | 240 | <20 | 240 |
| | dielectric loss tangent | | 0.0043 | 0.005 | 0.0046 | 0.0038 | 0.005 |
| | heat resistance degradation ratio (%) of dielectric loss tangent | | 10 | 35 | 28 | 0 | 34 |

From Tables 1 and 2, it will be understood that, in the cases in which a resin composition containing a modified polyphenylene ether having, at a terminal, a group represented by the above formula (1), a radical-polymerizable compound having, only at molecular terminals, two or more bonds or groups of at least one selected from the group consisting of a carbon-carbon unsaturated double bond and a maleimide group, a styrene-based thermoplastic elastomer in which the content ratio of repeating units having a carbon-carbon unsaturated double bond not belonging to an aromatic ring is less than 10 mol %, and an organic peroxide is used (Examples 1 to 17), a cured product being excellent in dielectric properties with sufficiently suppressed generation of thermal degradation on the dielectric properties can be obtained.

Specifically, it will be understood that the heat resistance degradation ratio of the dielectric loss tangent in Examples 1 to 17 is lower as compared with a case in which a modified polyphenylene ether other than the modified polyphenylene ether having, at a terminal, a group represented by the above formula (1) is used (Comparative Example 1).

Also, it will be understood that the heat resistance degradation ratio of the dielectric loss tangent in Examples 1 to 17 is lower as compared with a case in which the styrene-based thermoplastic elastomer is not contained (Comparative Examples 3 and 6). Even in Comparative Example 6 containing an antioxidant, the heat resistance degradation ratio of the dielectric loss tangent was high. From these, it will be understood that it is not sufficient even when an antioxidant is contained, and that incorporation of the styrene-based thermoplastic elastomer contributes to decrease in the heat resistance degradation ratio of the dielectric loss tangent.

Also, it will be understood that the heat resistance degradation ratio of the dielectric loss tangent in Examples 1 to 17 is lower as compared with a case in which a radical-polymerizable compound having a carbon-carbon unsaturated double bond in a molecule other than at molecular terminals, which is not the radical-polymerizable compound having, only at molecular terminals, two or more bonds or groups of at least one selected from the group consisting of a carbon-carbon unsaturated double bond and a maleimide group, is used (Comparative Example 2). From this, it will be understood that incorporation of a radical-polymerizable compound that does not have a carbon-carbon unsaturated double bond in a molecule other than at molecular terminals contributes to decrease in the heat resistance degradation ratio of the dielectric loss tangent.

Also, it will be understood that the heat resistance degradation ratio of the dielectric loss tangent in Examples 1 to 17 is lower as compared with a case in which a styrene-based thermoplastic elastomer in which the content ratio of repeating units having a carbon-carbon unsaturated double bond not belonging to an aromatic ring is 10 mol % or more is used (Comparative Example 4). From this, it will be understood that incorporation of a styrene-based thermoplastic elastomer in which the amount of carbon-carbon unsaturated double bonds not belonging to an aromatic ring is small contributes to decrease in the heat resistance degradation ratio of the dielectric loss tangent.

Also, the formed prepreg was confirmed by eye inspection, and impregnation property of the resin composition into a fibrous base member was confirmed by eye inspection. As a result, it has been found out that, in Examples 1 to 5, 7 to 12, and 14 to 17 in which the ratio of a sum of the content of the modified polyphenylene ether and the content of the radical-polymerizable compound to the content of the styrene-based thermoplastic elastomer is 50:50 to 95:5 in mass ratio, the fibrous base member was suitably impregnated with the resin composition as compared with a case in which the content of the styrene-based thermoplastic elastomer is larger than this (Example 6). From this, it will be understood that, in view of the impregnation property, it is preferable that the ratio of a sum of the content of the modified polyphenylene ether and the content of the radical-polymerizable compound to the content of the styrene-based thermoplastic elastomer is 50:50 to 95:5 in mass ratio.

Also, the formed prepreg was confirmed by eye inspection, and impregnation property of the resin composition into a fibrous base member was confirmed by eye inspection. As a result, it has been found out that, in a case in which the styrene-based thermoplastic elastomer had a weight average molecular weight of 10000 to 300000 (Examples 1, 12, and 14 to 17), the fibrous base member was suitably impregnated with the resin composition as compared with a case in which the weight average molecular weight of the styrene-based thermoplastic elastomer exceeded 300000. From this, it will be understood that, in view of the impregnation property, it is preferable that the weight average molecular weight of the styrene-based thermoplastic elastomer is 10000 to 300000.

This application is based on Japanese Patent Application No. 2017-039725 filed on Mar. 2, 2017, the contents of which are incorporated in the present application.

While the present invention has been fully and appropriately described in the above by way of embodiments in order to express the present invention, it is to be recognized that those skilled in the art can readily change and/or modify the embodiments described above. Therefore, it is to be construed that the changes or modifications made by those skilled in the art are encompassed within the scope of the claims unless those changes or modifications are at a level that departs from the scope of the claims described in the claims section of the present application.

INDUSTRIAL APPLICABILITY

According to the present invention, there is provided a resin composition by which a cured product with excellent dielectric properties and with sufficiently suppressed generation of thermal degradation on the dielectric properties can be obtained. Also, according to the present invention, there are provided a prepreg, a resin-coated film, a resin-coated metal foil, a metal-clad laminate, and a wiring board that are obtained by using the aforementioned resin composition.

The invention claimed is:

1. A resin composition comprising:

a modified polyphenylene ether having, at a terminal, a group represented by the following formula (1):

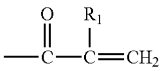

(1)

wherein $R_1$ represents a hydrogen atom or an alkyl group;

a radical-polymerizable compound having, only at molecular terminals, two or more bonds or groups of at least one selected from the group consisting of a carbon-carbon unsaturated double bond and a maleimide group;

a styrene-based thermoplastic elastomer in which repeating units having a carbon-carbon unsaturated double bond not belonging to an aromatic ring are contained in an amount of 0 to 2 mol % with respect to all repeating units, the styrene-based thermoplastic elastomer containing at least one selected from the group consisting of a hydrogenated methylstyrene (ethylene/butylene) methylstyrene copolymer and a hydrogenated methylstyrene (ethylene/ethylene propylene) methylstyrene copolymer; and an organic peroxide, wherein a content of the modified polyphenylene ether is 30 to 80 parts by mass with respect to 100 parts by mass of a sum of the modified polyphenylene ether, the radical-polymerizable compound, and the styrene-based thermoplastic elastomer, a content of the radical-polymerizable compound is 32 to 50 parts by mass with respect to 100 parts by mass of a sum of the modified polyphenylene ether, the radical-polymerizable compound, and the styrene-based thermoplastic elastomer, and a content of the styrene-based thermoplastic elastomer is 5 to 20 parts by mass with respect to 100 parts by mass of a sum of the modified polyphenylene ether, the radical-polymerizable compound, and the styrene-based thermoplastic elastomer.

2. The resin composition according to claim 1, wherein, in the styrene-based thermoplastic elastomer, a ratio of the repeating units having a carbon-carbon unsaturated double bond contained in a molecular chain among the repeating units having a carbon-carbon unsaturated double bond not belonging to an aromatic ring is less than 3 mol % with respect to all the repeating units.

3. The resin composition according to claim 2, wherein the carbon-carbon unsaturated double bond contained in the molecular chain is a vinylene group.

4. The resin composition according to claim 1, wherein the radical-polymerizable compound is a radical-polymerizable compound having, only at molecular terminals, two or more groups of at least one selected from the group consisting of allyl group, vinyl group, acrylate group, methacrylate group, and maleimide group.

5. The resin composition according to claim 1, wherein the modified polyphenylene ether has a weight average molecular weight of 500 to 3000 and has, at a molecular terminal, an average of 1 to 5 groups represented by the formula (1) given above per one molecule.

6. The resin composition according to claim 1, wherein the styrene-based thermoplastic elastomer has a weight average molecular weight of 10000 to 300000.

7. A prepreg comprising a fibrous base member and the resin composition according to claim 1 or a semi-cured product of the resin composition.

8. A resin-coated film comprising a support film and a resin layer containing the resin composition according to claim 1 or a semi-cured product of the resin composition.

9. A resin-coated metal foil comprising a metal foil and a resin layer containing the resin composition according to claim 1 or a semi-cured product of the resin composition.

10. A metal-clad laminate comprising a metal foil and an insulating layer containing a cured product of the resin composition according to claim 1.

11. A wiring board comprising a wiring and an insulating layer containing a cured product of the resin composition according to claim 1.

12. The resin composition according to claim 1, wherein the content of the modified polyphenylene ether is 30 to 63 parts by mass with respect to 100 parts by mass of a sum of the modified polyphenylene ether, the radical-polymerizable compound, and the styrene-based thermoplastic elastomer.

* * * * *